(12) United States Patent
Pekny

(10) Patent No.: US 6,677,804 B2
(45) Date of Patent: Jan. 13, 2004

(54) DUAL BANDGAP VOLTAGE REFERENCE SYSTEM AND METHOD FOR REDUCING CURRENT CONSUMPTION DURING A STANDBY MODE OF OPERATION AND FOR PROVIDING REFERENCE STABILITY DURING AN ACTIVE MODE OF OPERATION

(75) Inventor: Theodore T. Pekny, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/074,176

(22) Filed: Feb. 11, 2002

(65) Prior Publication Data

US 2003/0151957 A1 Aug. 14, 2003

(51) Int. Cl.[7] .................................................. G05F 1/10
(52) U.S. Cl. ........................ 327/535; 327/536; 327/538; 327/539
(58) Field of Search ................................. 327/530, 535, 327/538, 539, 536; 365/189.09, 194, 226, 227, 228, 229

(56) References Cited

U.S. PATENT DOCUMENTS

| | | | | |
|---|---|---|---|---|
| 3,887,863 A | | 6/1975 | Brokaw ........................ 323/19 |
| 5,051,686 A | | 9/1991 | Schaffer ...................... 323/313 |
| 5,087,834 A | * | 2/1992 | Tsay ............................ 327/539 |
| 5,280,455 A | * | 1/1994 | Kanaishi ...................... 365/229 |
| 5,712,590 A | * | 1/1998 | Dries et al. .................. 327/539 |
| 5,862,096 A | * | 1/1999 | Yasuda et al. ............... 365/226 |
| 6,101,137 A | * | 8/2000 | Roh ............................. 365/194 |
| 6,400,213 B2 | * | 6/2002 | Shih et al. ................... 327/539 |
| 6,492,863 B2 | * | 12/2002 | Kono et al. .................. 327/538 |

OTHER PUBLICATIONS

"Bandgap Circuit," (Jan. 4, 2002) >http://www.ele.uri.edu/Courses/ele535/startup.kills/gap.html≦ pp. 1–2.
"Chopping: A Technique for Noise and Offset Reduction," Internet Business Systems, Inc., 2001, pp. 1–6.
"The Design of Band–Gap Reference Circuits: Trials and Tribulations," IEEE Proceedings of the 1990 Bipolar Circuits and Technology Meeting, Sep. 1990, pp. 1–14.
Jenkins, A., "Analogue and Mixed Signal Integrated Circuit Design," Text & Images Bolton Institute and Northumbria University, 1999, pp. 1–9.
Kauffman, B., "Basic Operation of Bandgap Voltage References," AMI Semiconductor Application Specifics Newsletter, 1998, pp. 1–3.
"Selecting Voltage References," Maxim Integrated Products, 2001, pp. 1–15.

* cited by examiner

Primary Examiner—Trong Phan
(74) Attorney, Agent, or Firm—Dorsey & Whitney LLP

(57) ABSTRACT

A method of operating a memory includes generating a first reference voltage and detecting an active mode of operation of the memory. Upon detection of the active mode, commencing the charging of a node to develop a second reference voltage having a desired value on the node. The word line drive voltage is generated using the first reference voltage while the node is charging the second reference voltage to the desired value. The word line drive voltage is generated using the second reference voltage once the second reference voltage on the node has been charged to the desired value. A standby mode of operation of the memory is detected, and upon detection of the standby mode, the charging of the node is terminated and the word line drive voltage is generated using the first reference voltage.

17 Claims, 5 Drawing Sheets

DUAL BANDGAP VOLTAGE REFERENCE SYSTEM AND METHOD FOR REDUCING CURRENT CONSUMPTION DURING A STANDBY MODE OF OPERATION AND FOR PROVIDING REFERENCE STABILITY DURING AN ACTIVE MODE OF OPERATION

TECHNICAL FIELD

The present invention relates generally to integrated circuits, and more specifically to lowering power consumption in integrated circuits during certain modes of operation.

BACKGROUND OF THE INVENTION

Many battery-powered portable electronic devices, such as laptop computers, Portable Digital Assistants, digital cameras, cell phones and the like, require memory devices that provide large storage capacity and low power consumption. One type of memory device that is well-suited to use in such portable devices is flash memory, which is a type of semiconductor memory that provides relatively large nonvolatile storage capacity for data. The nonvolatile nature of the storage means that the flash memory does not require power to retain the data, as will be appreciated by those skilled in the art.

A typical flash memory comprises a memory-cell array having an array of memory cells arranged in rows and columns and grouped into blocks. FIG. 1 illustrates a conventional flash memory cell 100 formed by a field effect transistor including a source 102 and drain 104 formed in a substrate 106, with a channel 108 being defined between the source and drain. Each of the memory cells 100 further includes a control gate 110 and a floating gate 112 formed over the channel 108 and isolated from the channel and from each other by isolation layers 114. In the memory-cell array, each memory cell 100 in a given row has its control gate 110 coupled to a corresponding word line WL and each memory cell in a given column has its drain 104 coupled to a corresponding bit line BL. An alternating source AS that switches between ground and an erase voltage is coupled to the source 102. The sources 102 of each memory cell 100 in a given block are coupled together to allow all cells in the block to be simultaneously erased, as will be appreciated by those skilled in the art.

The memory cell 100 is charged or programmed by applying appropriate voltages to the source 102, drain 104, and control gate 110 and thereby injecting electrons e$^-$ from the drain 104 and channel 108 through the isolation layer 114 and onto the floating gate 112. Similarly, to erase the memory cell 100, appropriate voltages are applied to the source 102, drain 104, and control gate 110 to remove electrons e$^-$ through the isolation layer 114 to the source 102 and channel 108. The presence or absence of charge on the control gate 112 adjusts a threshold voltage of the memory cell 100 and in this way stores data in the memory cell. When charge is stored on the floating gate 112, the memory cell 100 does not turn ON when an access voltage is applied through the word line WL to the control gate 110, and when no charge is stored on the floating gate the cell turns ON in response to the access voltage. In this way, the memory cell 100 stores data having a first logic state when the cell turns ON and having a second logic state when the cells does not turn ON.

To reduce the power consumption and thereby extend the battery life in portable electronic devices, the flash memory typically operates in a low-power or standby mode when the memory is not being accessed. When a flash memory is operating in the standby mode, the memory will at some point be activated to commence data transfer operations in an active mode of operation. For example, in a portable device the flash memory may be operated in the standby mode when a key has not been pressed for a specified time, and be activated in response to a user pressing a key. The time required to switch from the standby mode to the active mode is ideally minimized so that a user does not experience a delay due to the flash memory changing modes of operation. Thus, the flash memory should be able to begin transferring data to and from the memory cells 100 as soon as possible after termination of the standby mode. In a conventional flash memory, a chip enable signal CE# is applied to the memory and places the memory in the standby and active modes when inactive high and active low, respectively. The "#" designates a signal as being active low, as will be appreciated by those skilled in the art.

Certain circuits within the flash memory continue operating during the standby mode to enable the flash memory to more quickly return to the active mode of operation. For example, as illustrated in FIG. 2, a conventional flash memory includes a charge pump 200 that generates a word line drive voltage VX that is used by row drivers 202 in activating corresponding word lines WL. Each row driver 202 is coupled to a respective word line WL1–WLN in the memory-cell array (not shown) and receives a corresponding decoded row address signal DRA1–DRAN. When the received DRA1–DRAN signal indicates the corresponding row of memory cells 100 is to be activated, the row driver 202 applies the voltage VX to the word line WL1–WLN to thereby activate he row of memory cells 100 (not shown in FIG. 2) coupled to the word line. When the received DRA1–DRAN signal indicates the corresponding row of memory cells 100 is to be deactivated, the row driver 202 drives the corresponding word line WL1–WLN to ground to deactivate the row of memory cells 100.

During the standby mode, the charge pump 200 continues generating the word line drive voltage VX so that the row drivers 202 can more quickly activate a selected word line WL when the flash memory is thereafter placed in the active mode. The faster the flash memory can activate a selected word line WL, the faster data can be read from the memory upon return to the active mode, and thus the faster a portable electronic device containing the memory can return to normal operation. As will be understood by those skilled in the art, a bandgap voltage reference 204 generates a bandgap voltage reference VBG that is supplied to the charge pump 200, and the charge pump 200 utilizes the bandgap reference voltage VBG in generating the supply voltage VX, as will be understood by those skilled in the art. The bandgap voltage reference 204 is a popular analog circuit for generating the bandgap reference voltage VBG that is very stable as a function of temperature and as a function of variations in a supply voltage VCC supplied to the bandgap voltage reference. One skilled in the art will understand various circuits that can be utilized in forming the bandgap voltage reference 204, charge pump 200, and row drivers 202, and thus, for the sake of brevity, the details of these components will not be discussed herein. Moreover, although the voltage reference 204 is described as being a bandgap voltage reference, other suitable voltage references may also be utilized, as will be understood by those skilled in the art.

In operation, the conventional bandgap voltage reference 204 consumes a relatively large current in generating the reference voltage VBG. As will be appreciated by those skilled in the art, the bandgap voltage reference 204 draws a relatively large current to enable the voltage reference to quickly charge the reference voltage VBG to its desired value and maintain the reference voltage in response to fluctuations in the supply voltage VCC. As a result, during the standby mode of operation the bandgap voltage reference 204 draws a relatively large current, which increases the power consumption of the flash memory containing the bandgap voltage reference and reduces the battery life of a portable device containing the memory. If a low-current bandgap voltage reference 204 were used, the bandgap reference voltage VBG will not have the required stability as a function of temperature and variations in the supply voltage VCC, and the bandgap voltage reference would take an undesirably long time to charge the voltage VBG to the desired value when the supply voltage VCC is initially supplied to the bandgap voltage reference.

There is a need for reducing the current consumption of a flash memory during a standby mode of operation while still providing a highly stable bandgap reference voltages to required circuits in the memory, and for minimizing the time required for the flash memory to switch from the standby to active mode of operation.

SUMMARY OF THE INVENTION

According to one aspect of the present invention, a voltage switching circuit includes an active voltage reference receiving a mode signal and operable responsive to the mode signal going active to generate a first reference voltage. The active voltage reference terminates generation of the first reference voltage responsive to the mode signal going inactive. A standby voltage reference generates a second reference voltage, and a multiplexer coupled to the active and standby voltage references applies the first and second reference voltages on an output responsive to a selection signal going active and inactive, respectively. A delay circuit is coupled to the multiplexer and receives the mode signal. The delay circuit drives the selection signal active a delay time after the mode signal goes active in response to the mode signal going active and drives the selection signal inactive without the delay time responsive to the mode signal going inactive.

According to another aspect of the present invention, a method of operating a memory includes generating a first reference voltage and detecting an active mode of operation of the memory. Upon detection of the active mode, commencing the charging of a node to develop a second reference voltage having a desired value on the node. The word line drive voltage is generated using the first reference voltage while the node is charging the second reference voltage to the desired value. The word line drive voltage is generated using the second reference voltage once the second reference voltage on the node has been charged to the desired value. A standby mode of operation of the memory is detected, and upon detection of the standby mode, the charging of the node is terminated and the word line drive voltage is generated using the first reference voltage.

DETAILED DESCRIPTION OF THE INVENTION

Figure 3A:
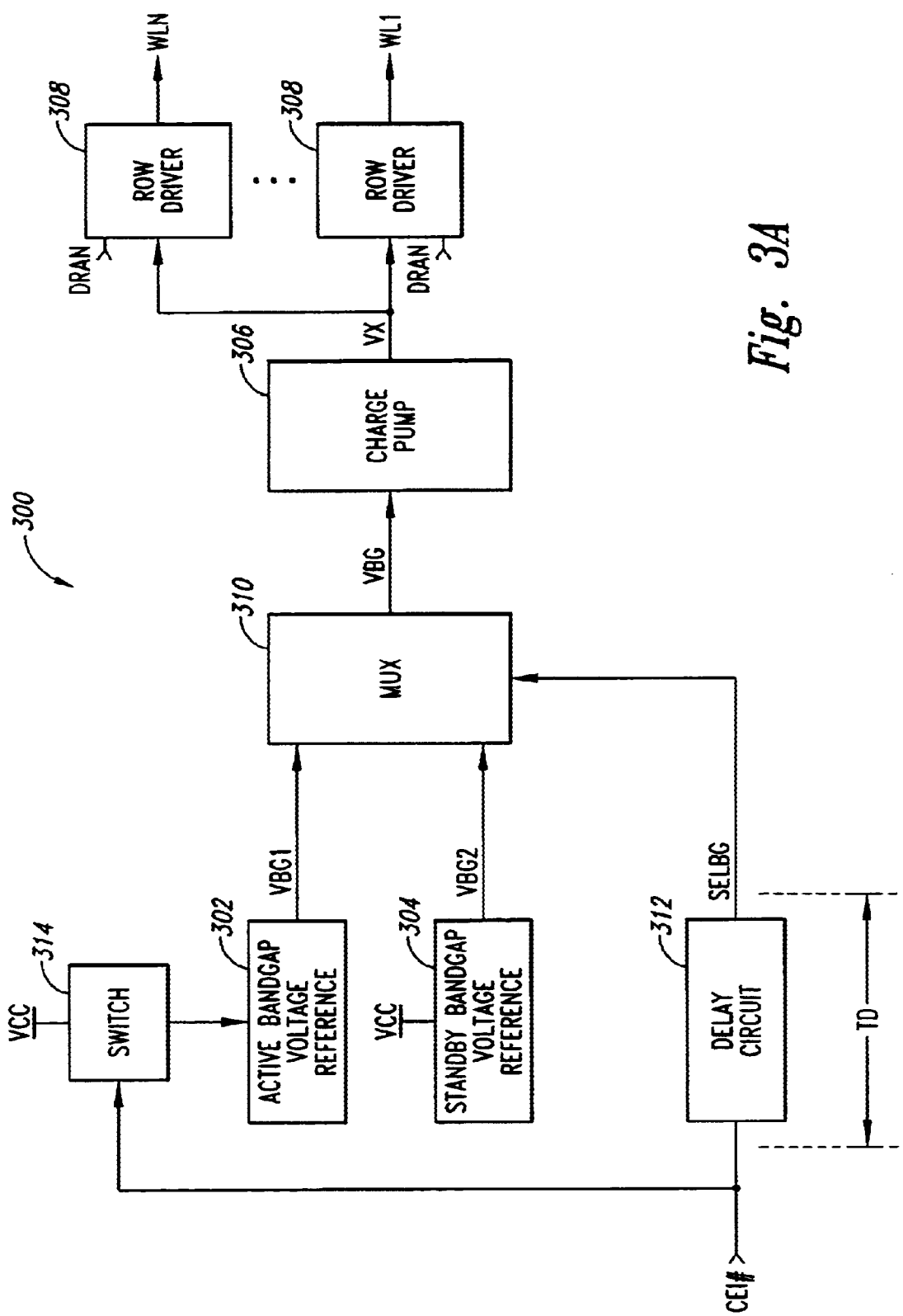
FIG. 3A is a functional block diagram illustrating a voltage reference switching circuit including dual bandgap voltage references according to one embodiment of the present invention.

FIG. 3A is a functional block diagram illustrating a voltage reference switching circuit 300 including an active bandgap voltage reference 302 for generating a bandgap reference voltage VBG during an active mode of operation of a flash memory (not shown) containing the switching circuit, and including a standby bandgap voltage reference 304 for generating the bandgap reference voltage during a standby mode of operation of the flash memory, as will be explained in more detail below. The active bandgap voltage reference 302 consumes a relatively large amount of power and operates only during the active mode, while the standby bandgap voltage reference 304 consumes a relatively small amount of power and operates during the standby mode. The switching circuit 300 reduces the power consumption of the flash memory during the standby mode, and also reduces a transition time of the flash memory in switching between the active and standby modes, as will described in more detail below.

In the following description, certain details are set forth to provide a sufficient understanding of the present invention, but one skilled in the art will appreciate that the invention may be practiced without these particular details. In other instances below, the operation of well known components have not been shown or described in detail to avoid unnecessarily obscuring the present invention.

Figure 2:
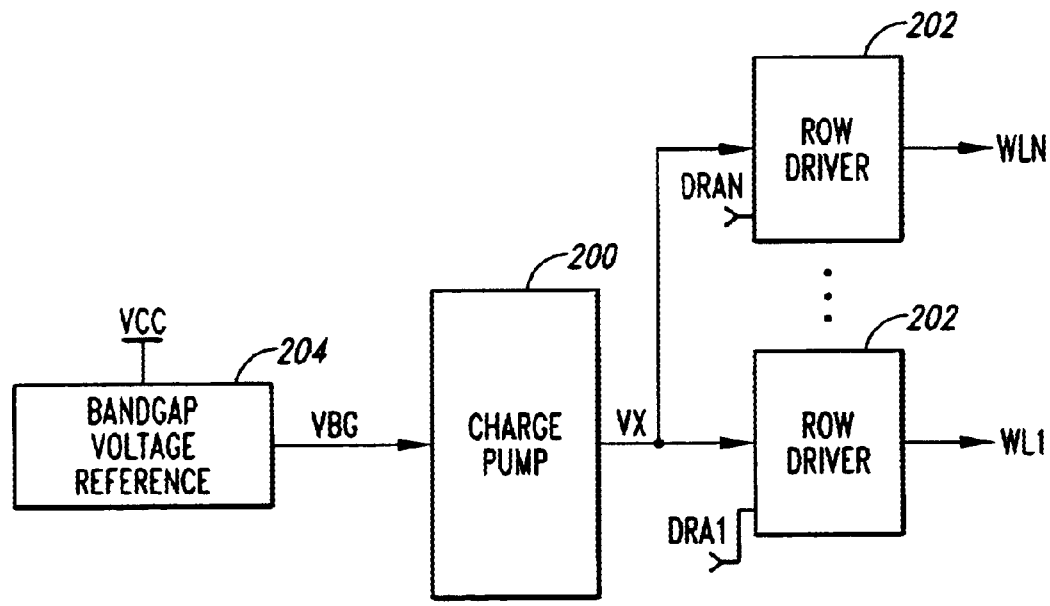
FIG. 2 is a schematic illustrating a conventional charge pump and bandgap voltage reference for generating a word line drive voltage used by a row driver in accessing data stored in the memory cell of FIG. 1.
Figure 3B:
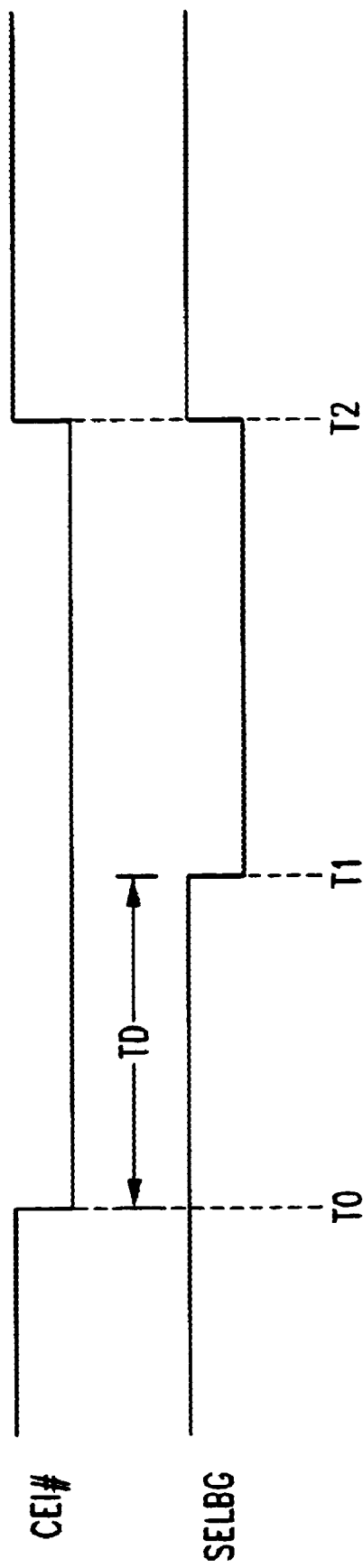
FIG. 3B is a timing diagram illustrating various signals generated during operation of the voltage reference switch of FIG. 3A.

The bandgap switching circuit 300 further includes a charge pump 306 that supplies a word line drive voltage VX to a plurality of row drivers 308. The charge pump 306 and row drivers 308 operate in the same manner as the charge pump 200 and row drivers 202 of FIG. 2, and thus, for the sake of brevity, the operation of these components will not again be described in detail. In the bandgap switching circuit 300, a multiplexer 310 receives a first bandgap voltage VBG1 from the active bandgap voltage reference 302 and receives a second bandgap voltage reference VBG2 from the standby bandgap voltage reference 304. The multiplexer 310 applies either the VBG1 or VBG2 voltage to the charge pump 306 as the VBG voltage in response to a band gap selection signal SELBG generated by a delay circuit 312, which generates the SELBG signal in response to an internal chip enable signal CEI#. In operation, when the CEI# signal goes active low, the delay circuit 312 drives the SELBG signal low after a time delay TD. When the CEI# signal goes in active high, the delay circuit 312 drives the SELBG signal high with a substantially no time delay. With reference to FIG. 3B, at a time T0, the CEI# signal goes active low, causing the SELBG signal to go low at a time T1 after the time delay TD has elapsed. At a time T2, the CEI# signal goes inactive high, and the SELBG goes high with substantially no time delay. The delay circuit 312 is conventional and suitable delay circuits can be implemented using conventional designs and circuitry well known by those ordinarily skilled in the art. In response to the SELBG signal being low, the multiplexer 310 outputs the VBG1 voltage as the VBG voltage applied to the charge pump 306. In contrast, when the SELBG signal is high, the multiplexer 310 outputs the VBG2 voltage as the VBG voltage applied to the charge pump 306. In one embodiment, the voltages VBG1 and VBG2 are equal. However, it will be appreciated that changes to the reference voltages VBG1 and VBG2 generated by the active and standby bandgap voltage references 302, 304, respectively, can be unequal as well without departing from the scone of the present invention.

In the bandgap switching circuit 300, the standby bandgap voltage reference 304 receives a supply voltage VCC directly, and generates the VBG2 voltage from the supply voltage. The active bandgap voltage reference 302 does not receive the supply voltage VCC directly, but instead receives the supply voltage through a switch 314 that selectively couples the supply voltage to and isolates the supply voltage from the active bandgap voltage reference in response to the CEI# signal. When the CEI# signal is active low, the switch 314 supplies the supply voltage VCC to the active bandgap voltage reference 302 which, in turn, generates the VBG1 voltage from the supply voltage. When the CEI# signal is inactive high, the switch 314 isolates the supply voltage VCC from the active bandgap voltage reference 302 to thereby turn OFF the active bandgap voltage reference.

In operation, the bandgap switching circuit 300 operates in an active mode and a standby mode in response to the CEI# signal being active low and inactive high, respectively. The active and standby modes of the bandgap switching circuit 300 correspond to the active and standby modes of operation of the flash memory containing the bandgap switching circuit. For the following description of the overall operation of the bandgap switching circuit 300, assume the band gap switching circuit 300 is initially operating in the active mode, with the CEI# and SELBG signals being low. In response to the low CEI# signal, the switch 314 applies the supply voltage VCC to the active bandgap voltage reference 302 which, in turn, generates the VBG1 voltage. The low SELBG signal also causes the multiplexer 310 to apply the VBG1 voltage to the charge pump 306 as the VBG voltage. The charge pump 306 thereafter operates as previously described to generate the VX voltage using the applied VBG voltage, and applies the VX voltage to the row drivers 308 which operate as previously described to selectively apply the VX voltage on the word lines WL1–WLN responsive to the decoded row address signals DRA1–DRAN. Note that during the active mode, the standby band gap voltage reference 304 generates the VBG2 voltage although this voltage is not utilized (the multiplexer 310 isolates this voltage). The standby bandgap voltage reference 304 consumes a relatively small amount of power, however, as previously mentioned, and thus does not significantly increase the power consumption of the flash memory during the active mode.

When the CEI# signal goes inactive high, the bandgap switching circuit 300 commences operation in the standby mode. In response to the high CEI# signal, the switch 314 isolates the supply voltage VCC from the active bandgap voltage reference 302, turning the active bandgap voltage reference OFF. Also in response to the CEI# signal going high, the delay circuit 312 drives the SELBG signal high, causing the multiplexer 310 to apply the VBG2 voltage from the standby bandgap voltage reference 304 to the charge pump 306 as the VBG voltage. At this point, the relatively high-power active bandgap voltage reference 302 is turned OFF while the relatively low power standby bandgap voltage reference 304 supplies the VBG voltage to the charge pump 306. In this way, the charge pump 306 utilizes the VBG voltage from the standby bandgap voltage reference 304 in generating the VX voltage during the standby mode of operation. The power consumption of the flash memory containing the bandgap switching circuit 300 is accordingly reduced since only the relatively low power standby bandgap voltage reference 304 operates during the standby mode.

Figure 1:
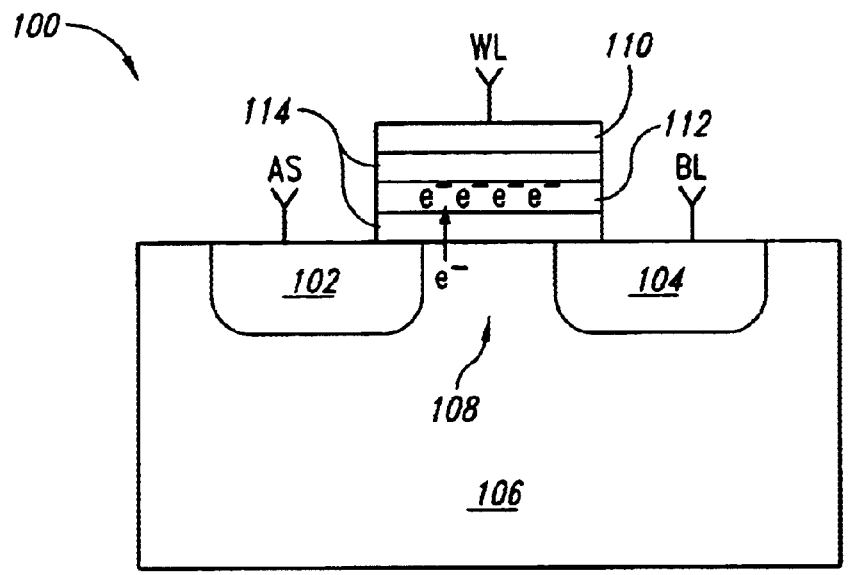
FIG. 1 is a simplified cross-sectional view of a conventional flash memory cell.

When the CEI# signal goes low, the bandgap switching circuit 300 terminates operation in the standby mode and commences operation in the active mode. In response to the low CEI# signal, the switch 314 applies the supply voltage VCC to the active bandgap voltage reference 302 which, in turn, begins charging the VBG1 voltage to its desired value. At this point, although the CEI# signal is active low, the delay circuit 312 continues driving the SELBG signal high and thus the multiplexer 310 continues providing the VBG voltage from the standby bandgap voltage reference 304 to the charge pump 306. Recall, the delay circuit 312 does not drive the SELBG signal low until the delay time TD after the CEI# signal goes low. Thus, while the active bandgap voltage reference 302 is charging the VBG1 voltage to the desired value during the delay time TD, the standby bandgap voltage reference 304 supplies the VBG voltage to the charge pump 306. The charge pump 306 thus continues generating the VX voltage using the VBG voltage from the standby bandgap voltage reference 304, allowing any of the row drivers 308 to activate the corresponding word line WL1–N using the VX voltage of the charge pump. As a result, if a data transfer command such as a read command is applied to the flash memory before expiration of the delay time TD, the selected row driver 308 can activate the corresponding word line WL1–N to access the addressed row of memory cells 100 (FIG. 1). This is true even though the active bandgap voltage reference 302 has not yet charged the VBG1 voltage to the desired value. After expiration of the delay time TD, the delay circuit 312 drives the SELBG signal low causing the multiplexer 310 to apply the VBG voltage from the active bandgap voltage reference 302 to the charge pump 306 which thereafter operates as previously described in generating about VX voltage from the applied VBG voltage. It will be appreciated by those ordinarily skilled in the art that the delay time TD can be equal to or greater than the time for the active bandgap voltage reference 302 to charge to the VBG1 voltage. However, as will be further appreciated, the particular length of the delay time TD can be modified without departing from the scope of the present invention.

With the bandgap switching circuit 300, several data transfer operations can occur before expiration of the delay time TD and thus prior to the active bandgap voltage reference 302 charging the VBG1 voltage to the required value. For example, a typical flash memory may have a read cycle time on the order of 50 nanoseconds. A typical time required for the active bandgap voltage reference 302 to charge the VBG1 voltage to the required value is 200–300 nanoseconds. Thus, during the delay time TD when the VBG1 voltage is charging to the required value, several read cycles may occur with the charge pump 306 using the VBG2 voltage from the standby voltage reference 304 in generating the VX voltage. The value of the VBG2 voltage is subject to more variation than the VBG1 voltage due to the inherent characteristics of the standby voltage reference 304. Moreover, such variations in the VBG2 voltage can cause variations in the value of the VX voltage generated by the charge pump 306. If the VX voltage varies too much from its required value, problems in accessing row of memory cells 100 (FIG. 1) could arise, as will be understood by those skilled in the art. This is, in part, is why flash memories do not simply use a single low power but less accurate voltage reference like the standby voltage reference 304. In the bandgap switching circuit 300, however, the less accurate VBG2 voltage from the standby reference voltage 304 is used at most for only several data transfer operations. This short duration for use of the VBG2 voltage, which is less than the delay time TD, reduces the likelihood of any intolerable variations in the VX voltage generated using the VBG2 voltage. Moreover, typically when the flash memory transitions from the standby mode to the active mode the first data transfer operation are read commands applied to read data from the memory. During read commands, the value of the VX voltage is less critical than during write or erase operations, as will be understood by those skilled in the art. Thus, the VBG2 voltage will typically be used in generating the VX voltage only during read data transfers, which further lessens the likelihood of any intolerable variations in the VX voltage due to variations in the VBG2 voltage.

The bandgap switching circuit 300 utilizes the dual bandgap voltage references 302, 304 to reduce the power consumption of the flash memory containing the bandgap switching circuit, while at the same time keeping the transition time of the flash memory from the standby mode to the active mode relatively small. The power consumption is reduced by deactivating the relatively high power and high precision active bandgap voltage reference 302 during the standby mode and using the relatively low power standby bandgap voltage reference 304. In this way, the charge pump 306 utilizes the VBG2 voltage generated by the low power standby voltage reference 304 to maintain the VX voltage during the standby mode and the high power active voltage reference 302 is turned OFF. The less accurate VBG2 voltage can be used during the standby mode since the actual value of the VX voltage the charge pump 306 generates using the VBG2 voltage is less critical because the row drivers 308 are not actually applying the VX voltage to word lines WL1–WLN to access rows of memory cells 100 (FIG. 1).

The bandgap switching circuit 300 reduces the transition time of the corresponding flash memory from the standby to active mode through the use of the dual voltage references 302, 304. The standby bandgap voltage reference 304 generates the VBG2 voltage while the active bandgap voltage reference 302 is charging the VBG1 voltage. In this way, a processor or other device can apply data transfer commands to the flash memory relatively quickly after the memory is placed in the active mode, and the processor need not wait the relatively long time (200–300 nanoseconds as mentioned above) it takes the VBG1 voltage to charge to its required value. Note that during the active mode, the standby band gap voltage reference 304 generates the VBG2 voltage although the voltage is not being utilized. The standby bandgap voltage reference 304 consumes a relatively small amount of power, however, and thus does not significantly increase the power consumption of the flash memory during the active mode. One skilled in the art will understand various circuits that can be used in forming the components 302–314 in the bandgap switching circuit 300 of FIG. 3A and thus such circuits will not be described in detail herein.

In another embodiment of the bandgap switching circuit 300, the VBG2 voltage is used for a predetermined number of data transfer operations after commencement of the active mode, and in this way the VBG2 voltage is used while the VBG1 voltage is charging to its required value. In this embodiment, the delay circuit 312 would be replaced with a circuit that monitors commands applied to the memory and the mode of the memory, and develops the SELBG signal in response to the commands and mode. Another embodiment includes voltage monitoring circuitry in place of the delay circuit 312. The voltage monitoring circuitry monitors the value of the VBG1 voltage as it is charging, and when it reaches a predetermined value, applies the SELBG signal to the multiplexer 310, causing the multiplexer to apply the VBG1 voltage to the charge pump 306.

Figure 4:
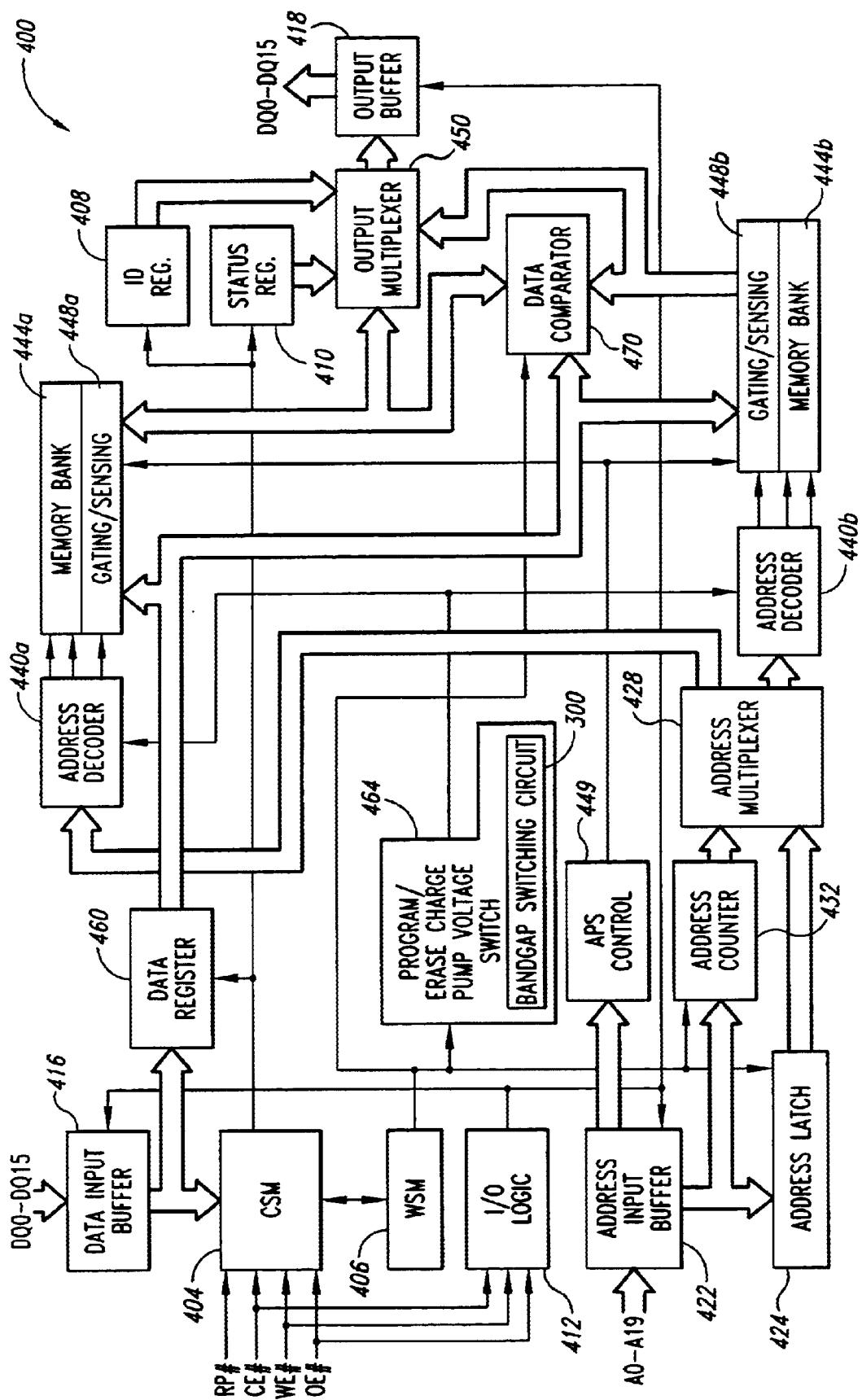
FIG. 4 is a functional block diagram of a flash memory including the voltage reference switching circuit of FIG. 3A.

FIG. 4 is a functional block diagram of a flash memory 400 including the bandgap switching circuit 300 of FIG. 3A. The bandgap switching circuit 300 is shown contained in a program/erase charge pump voltage switch 464, although the row drivers 308 (FIG. 3A) would typically be contained in address decoders 440a, 440b, as will be appreciated by those skilled in the art. The operation of the program/erase charge pump voltage switch 464 and address decoders 440a, 440b will be discussed in more detail below. The flash memory 400 includes a command state machine (CSM) 404 that receives control signals including a reset/power-down signal RP#, a chip enable signal CE#, a write enable signal WE#, and an output enable signal OE#, where the "#" denotes a signal as being low true. An external processor (not shown) applies command codes on a data bus DQ0–DQ15 and these command codes are applied through a data input buffer 416 to the CSM 404. A command being applied to the flash memory 400 includes the control signals RP#, CE#, WE#, and OE# in combination with the command codes applied on the data bus DQ0–DQ15. The CSM 404 decodes the commands and acts as an interface between the external processor and an internal write state machine (WSM) 408. When a specific command is issued to the CSM 404, internal command signals are provided to the WSM 408, which in turn, executes the appropriate process to generate the necessary timing signals to control the memory device 400 internally and accomplish the requested operation. In response to the RP# and/or CE# signals, the CSM 404 develops applies signals to the delay circuit 312 and switch 314 (see FIG. 3A) to control the mode of operation of the bandgap switching circuit 300. In one embodiment, when the CE# signal goes active low, the CSM 404 drives the CEI# signal low, placing the bandgap switching circuit 300 in the active mode of operation. When the CE# signal goes inactive high, the CSM 404 drives the CEI# signal inactive high, placing the bandgap switching circuit 300 in the standby mode of operation.

The CSM 404 also provides the internal command signals to an ID register 408 and a status register 410, which store information regarding operations within the flash memory 400. The external processor issues an appropriate command to the flash memory 400 to read the ID and status registers 408, 410 and thereby monitor the progress of various operations within the flash memory 400. The CE#, WE#, and OE# signals are also provided to input/output (I/O) logic 412 which, in response to these signals indicating a read or write command, enables a data input buffer 416 and a data output buffer 418, respectively. The I/O logic 412 also enables an address input buffer 422 which, in turn, applies address signals on an address bus A0–A19 to an address latch 424. The address latch 424 latches the applied address signals A0–A19 from the address input buffer 422 under control of the WSM 406.

The address multiplexer 428 selects between the address signals provided by the address latch 424 and those provided by an address counter 432. The address signals provided by the address multiplexer 428 are used by the address decoders 440a, 44b to access the memory cells of memory banks 444a, 444b that correspond to the address signals. A gating/ sensing circuit 448a, 448b is coupled to each memory bank 444a, 444b for the purpose of programming and erase operations, as well as for read operations. An automatic power saving (APS) control circuit 449 receives address signals from the address input buffer 422 and also monitors the control signals RP#, CE#, OE#, and WE#. When none of these lines toggle within a time-out period, the APS control circuit 449 generates control signals to place the gating/sensing circuits 448a, 448b in a power-saving mode of operation.

During a read operation, data is sensed by the gating/sensing circuit 448a, 448b and amplified to sufficient voltage levels before being provided to an output multiplexer 450. The read operation is completed when the WSM 406 instructs an output buffer 418 to latch data provided from the output multiplexer 450 which, in turn, applies the latched data over the data bus DQ0–DQ15 to the external processor. The output multiplexer 450 can also select data from the ID and status registers 408, 410 to be provided to the output buffer 418 when instructed to do so by the WSM 406. During a program or write operation, the external processor supplies data on the data bus DQ0–DQ15 and the I/O logic 412 commands the data input buffer 416 to provide the data to a data register 460 to be latched. The WSM 406 also issues commands to program/erase circuitry 464 which uses the address decoders 440a, 440b to access memory cells in the memory banks 444a, 444b. The program/erase circuitry 464 operates in combination with the address decoders 440a, 440b, data register 460, and gating/sensing circuits 448a, 448b to carry out the process of injecting or removing electrons from the accessed memory cells to thereby store the data latched by the data register 460 in the accessed memory cells. The program/erase circuitry 464 also controls the erasure of blocks of memory cells in the memory banks 444a, 444b. To ensure that sufficient programming or erasing has been performed, a data comparator 470 is instructed by the WSM 406 to compare or verify the state of the programmed or erased memory cells to the data latched by the data register 460.

The flash memory 400 operates in a standby power-savings mode when the RP# and CE# signals are both high, and operates in a reset deep power-down mode when the RP# signal goes active low. In response to the high CE# signal, the CSM 404 applies a high CEI# signal (FIG. 3A) to the bandgap switching circuit 300 which, in turn, turns OFF the active bandgap voltage reference 302 (FIG. 3A) as previously described, reducing the power consumption of the flash memory 400.

Figure 5:
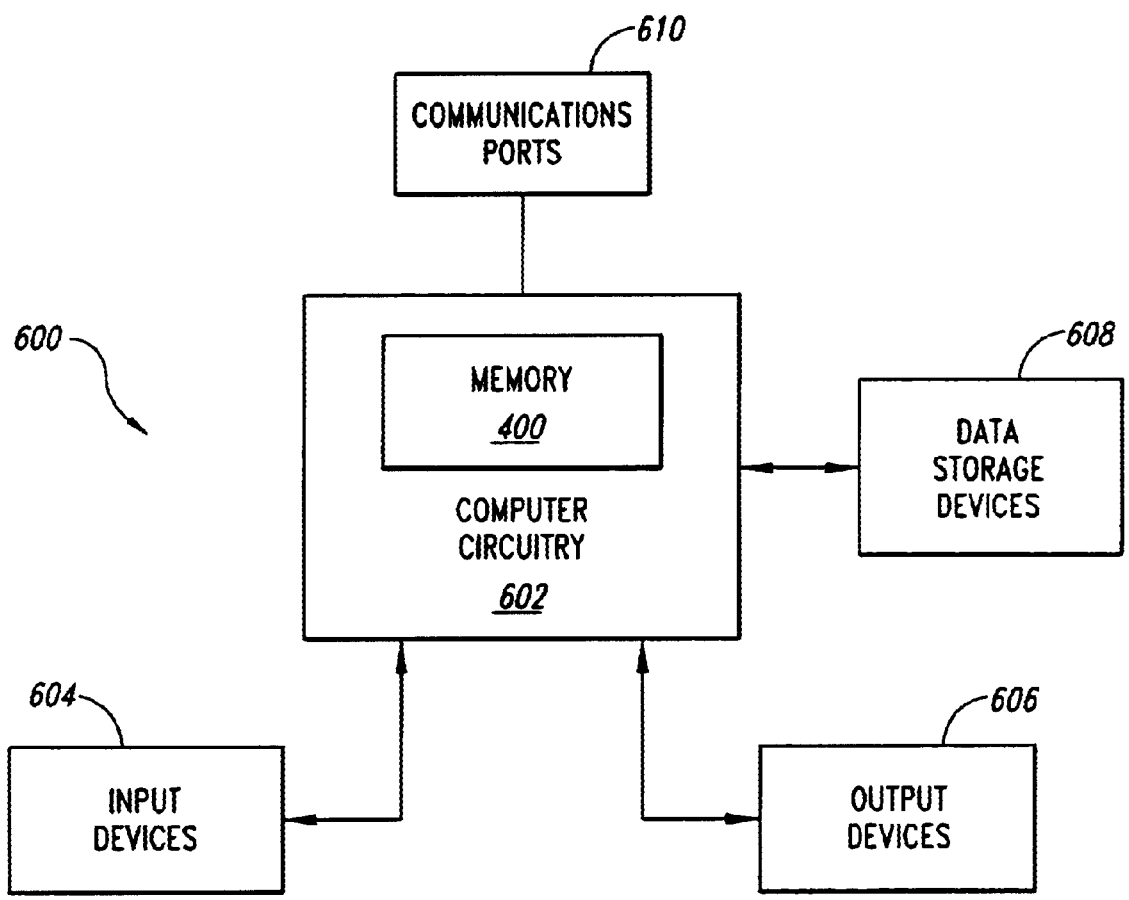
FIG. 5 is a functional block diagram illustrating a computer system including the flash memory of FIG. 4.

It will be appreciated that the embodiment of the flash memory 400 illustrated in FIG. 5 has been provided by way of example and that the present invention is not limited thereto. Those of ordinary skill in the art have sufficient understanding to modify the previously described flash memory embodiment to implement other embodiments of the present invention. For example, although the bandgap switching circuit 300 is shown as being contained in the program/erase charge pump voltage switch 464 and the row decoders 308 (FIG. 3A) indicated as being contained in the address decoders 440a, 440b, components of the bandgap switching circuit may be incorporated in other circuit blocks in the flash memory 400. The particular arrangement of the bandgap switching circuit 300 is a matter of design preference. Moreover, although the bandgap switching circuit 300 is described as including the bandgap voltage references 302, 304, other types of voltage reference circuits can also be utilized, as will be understood by those skilled in the art. Although the bandgap switching circuit 300 has been described with reference to flash memories, the circuit and principles described herein may also be applied to other types of memories and integrated circuits.

FIG. 5 is a block diagram of a computer system 600 including computer circuitry 602 that contains the flash memory 400 of FIG. 4. The computer circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or video display. One or more data storage devices 608 are also typically coupled to the computer circuitry 602 to store data or retrieve data from external storage media (not shown). Examples of typical storage devices 608 include hard and floppy disks, tape cassettes, compact disc read-only memories (CDROMs), read-write CD ROMS (CD-RW), and digital video discs (DVDs). The computer system 600 also typically includes communications ports 610 such as a universal serial bus (USB) and/or an IEEE-1394 bus to provide for communications with other devices, such as desktop or laptop personal computers, a digital cameras, and digital camcorders. The computer circuitry 602 is typically coupled to the flash memory 400 through appropriate address, data, and control busses to provide for writing data to and reading data from the flash memory.

Even though various embodiments and advantages of the present invention have been set forth in the foregoing description, the above disclosure is illustrative only, and changes may be made in detail and yet remain within the broad aspects of the invention. Therefore, the present invention is to be limited only by the appended claims.

What is claimed is:

1. A voltage switching circuit, comprising:
    an active voltage reference adapted to receive a mode signal, the active voltage reference operable responsive to the mode signal going active to generate a first reference voltage and operable responsive to the mode signal going inactive to terminate generation of the first reference voltage;
    a standby voltage reference operable to generate a second reference voltage;
    a multiplexer coupled to the active and standby voltage references and operable to apply the first reference voltage on an output responsive to a selection signal going active, and operable to apply the second reference voltage on the output responsive to the selection signal going inactive; and
    a delay circuit coupled to the multiplexer and adapted to receive the mode signal, the delay circuit operable responsive to the mode signal going active to drive the selection signal active a delay time after the mode signal goes active, and operable responsive to the mode signal going inactive to drive the selection signal inactive without the delay time.

2. The voltage switching circuit of claim 1 wherein the active and standby voltage references each comprise a bandgap voltage reference.

3. The voltage switching circuit of claim 1 wherein the active voltage reference comprises:
    a switch adapted to receive a supply voltage and operable to apply the supply voltage on a first terminal responsive to the mode signal going active and operable to isolate the first terminal from the supply voltage responsive to the mode signal going inactive; and a voltage generator coupled to the first terminal of the switch and operable to turn ON when the supply voltage is applied on the first terminal, and operable to turn OFF when the first terminal is isolated from the supply voltage.

4. The voltage switching circuit of claim 1 wherein the active voltage reference consumes more power in generating the first reference voltage than does the standby voltage reference in generating the second reference voltage.

5. The voltage switching circuit of claim 4 wherein the first reference voltage comprises a voltage having a value that is more precise and stable relative to the second reference voltage.

6. The voltage switching circuit of claim 1 wherein the first and second reference voltages have values that are ideally equal.

7. The voltage switching circuit of claim 1 wherein the delay time is equal to or greater than a time the active voltage reference takes to charge the first reference voltage to its desired value.

8. A voltage switching circuit for supplying a reference voltage to a charge pump, the voltage switching circuit comprising:

an active voltage reference adapted to receive a mode signal, the active voltage reference operable responsive to the mode signal going active to generate a first reference voltage and operable responsive to the mode signal going inactive to terminate generation of the first reference voltage;

a standby voltage reference operable to generate a second reference voltage;

a charge pump operable to generate a row drive voltage having a value that is a function of a reference voltage;

a plurality of row drivers, each row driver being adapted to receive a corresponding address signal and including a word line output, and being coupled to the charge pump to receive the row drive voltage, the row driver applying the row drive voltage on the word line output responsive to the address signal being active;

a multiplexer coupled to the active and standby voltage references to receive the first and second voltage references, respectively, and being coupled to the charge pump, the multiplexer applying the first reference voltage to the charge pump responsive to a selection signal going active, and applying the second reference voltage to the charge pump responsive to the selection signal going inactive;

a delay circuit coupled to the multiplexer and adapted to receive the mode signal, the delay circuit operable responsive to the mode signal going active to drive the selection signal active a delay time after the mode signal goes active, and operable responsive to the mode signal going inactive to drive the selection signal inactive without the delay time.

9. The voltage switching circuit of claim 8 wherein the active and standby voltage references each comprise a bandgap voltage reference.

10. The voltage switching circuit of claim 8 wherein the active voltage reference comprises:

a switch adapted to receive a supply voltage and operable to apply the supply voltage on a first terminal responsive to the mode signal going active and operable to isolate the first terminal from the supply voltage responsive to the mode signal going inactive; and a voltage generator coupled to the first terminal of the switch and operable to turn ON when the supply voltage is applied on the first terminal, and operable to turn OFF when the first terminal is isolated from the supply voltage.

11. The voltage switching circuit of claim 8 wherein the active voltage reference consumes more power in generating the first reference voltage than does the standby voltage reference in generating the second reference voltage.

12. The voltage switching circuit of claim 11 wherein the first reference voltage comprises a voltage having a value that is more precise and stable relative to the second reference voltage.

13. The voltage switching circuit of claim 8 wherein the first and second reference voltages have values that are ideally equal.

14. The voltage switching circuit of claim 8 wherein the delay time is equal to or greater than a time the active voltage reference takes to charge the first reference voltage to its desired value.

15. A voltage switching circuit, comprising:

a switch having a first terminal adapted to receive a supply voltage, a second terminal, and a control terminal adapted to receive a mode signal;

an active voltage reference coupled to the second terminal of the switch and including an output;

a standby voltage reference including an output;

a multiplexer having an output, a first input coupled to the output of the active voltage reference and a second input coupled to the output of the standby voltage reference, and having a selection input; and a delay circuit coupled to the selection input of the multiplexer and having an input adapted to receive the mode signal.

16. The voltage switching circuit of claim 15 wherein the active and standby voltage references each comprise a bandgap voltage reference.

17. The voltage switching circuit of claim 16 wherein the active voltage reference comprises a high precision and high power bandgap voltage reference and wherein the standby voltage reference comprises a low power and less precise bandgap voltage reference.

* * * * *